United States Patent
Ji et al.

(10) Patent No.: US 7,119,032 B2
(45) Date of Patent: Oct. 10, 2006

(54) METHOD TO PROTECT INTERNAL COMPONENTS OF SEMICONDUCTOR PROCESSING EQUIPMENT USING LAYERED SUPERLATTICE MATERIALS

(75) Inventors: Bing Ji, Allentown, PA (US); Stephen Andrew Motika, Kutztown, PA (US); Dingjun Wu, Macungie, PA (US); Eugene Joseph Karwacki, Jr., Orefield, PA (US); David Allen Roberts, Fogelsville, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 39 days.

(21) Appl. No.: 10/924,321

(22) Filed: Aug. 23, 2004

(65) Prior Publication Data

US 2006/0040508 A1   Feb. 23, 2006

(51) Int. Cl.
*H01L 21/31* (2006.01)
*H01L 21/469* (2006.01)

(52) U.S. Cl. ............... 438/758; 118/719; 257/E21.092
(58) Field of Classification Search ............... 438/758, 438/761, 438; 118/70, 719; 257/E21.092
See application file for complete search history.

(56) References Cited

U.S. PATENT DOCUMENTS

| | | | |
|---|---|---|---|
| 5,201,990 A | | 4/1993 | Chang et al. |
| 5,688,565 A | | 11/1997 | McMillan et al. |
| 5,831,277 A | * | 11/1998 | Razeghi ............... 257/15 |
| 5,873,977 A | | 2/1999 | Desu et al. |
| 6,056,994 A | | 5/2000 | Paz de Araujo et al. |
| 6,095,084 A | | 8/2000 | Shamouilian et al. |
| 6,307,221 B1 | * | 10/2001 | Danzilio ............... 257/192 |
| 6,533,910 B1 | | 3/2003 | O'Donnell et al. |
| 6,537,429 B1 | | 3/2003 | O'Donnell et al. |
| 6,613,442 B1 | | 9/2003 | O'Donnell et al. |
| 2001/0003271 A1 | | 6/2001 | Otsuki |
| 2002/0036064 A1 | * | 3/2002 | DeOmellas et al. ........ 156/345 |
| 2002/0043215 A1 | * | 4/2002 | Yoshioka et al. ........... 118/715 |
| 2002/0195056 A1 | * | 12/2002 | Sandhu et al. .............. 118/719 |
| 2003/0159657 A1 | | 8/2003 | Kaushal et al. |
| 2003/0162371 A1 | * | 8/2003 | Udagawa et al. ........... 438/478 |
| 2003/0185997 A1 | | 10/2003 | Hsieh |
| 2003/0200929 A1 | | 10/2003 | Otsuki |
| 2003/0219605 A1 | * | 11/2003 | Molian et al. .............. 428/422 |
| 2003/0226840 A1 | | 12/2003 | Dalton |
| 2004/0168637 A1 | * | 9/2004 | Gorokhovsky ........ 118/723 ER |
| 2005/0100748 A1 | * | 5/2005 | Cook et al. ................. 428/457 |

FOREIGN PATENT DOCUMENTS

| | | |
|---|---|---|
| EP | 1 026 281 A2 | 8/2000 |
| EP | 1191582 A1 | 3/2002 |
| WO | WO 99/20812 | 4/1999 |
| WO | WO 02/053794 A1 | 7/2002 |
| WO | WO 02/053797 A1 | 7/2002 |
| WO | WO 02/053799 A1 | 7/2002 |
| WO | WO 02/054454 A2 | 7/2002 |
| WO | WO 02/057506 A2 | 7/2002 |
| WO | WO 02/079538 A1 | 10/2002 |
| WO | WO 03/001559 A1 | 1/2003 |
| WO | WO 03/080892 A1 | 10/2003 |

OTHER PUBLICATIONS

XP000768900; Deornellas S P, et al.; "Etching New IC Materials for Memory Devices"; Solid State Technology, Penwell Corp., Tulsa, OK; vol. 41, No. 8, Aug. 1998; pp. 53-44, 56, 58.
XP002382346 & RU 2100067 C1; Database WPI; Section Ch, Week 199835; Derwent Publications Ltd., London, GB; Class HO6, AN 1998-411884; As Sibe Catalysis Inst; Dec. 24, 1997.
Hovsepian P.E., et al; "Recent Progress in Large-Scale Production of Nanoscale Multilayer/Superlattice Hard Coatings"; Vacuum, Pergamon Press, GB; vol. 69, No. 1-3; Dec. 24, 2003, pp. 27-36.
XP002383823; Database Inspec (Online) The Institution of Electrical Engineers, Stevenage, GB; Mar. 30, 2000; Ledermann, N., et al.; "Sputtered Silicon Carbide Thin Films as Protective Coating for MEMS Applications".

* cited by examiner

*Primary Examiner*—Caridad Everhart
(74) *Attorney, Agent, or Firm*—Geoffrey L. Chase

(57) ABSTRACT

This invention relates to apparatus and a method to protect the internal components of semiconductor processing equipment such as a plasma reactor or a reactive species generator against physical and/or chemical damages during etching and/or cleaning processes. Layered superlattice materials having three or more metal elements such as strontium bismuth tantalate (SBT) are used to form a protective barrier on the surfaces of the internal components of a reaction chamber.

19 Claims, No Drawings

METHOD TO PROTECT INTERNAL COMPONENTS OF SEMICONDUCTOR PROCESSING EQUIPMENT USING LAYERED SUPERLATTICE MATERIALS

BACKGROUND OF THE INVENTION

In the manufacture of semiconductor integrated circuits (IC), dielectric materials such as silicon dioxide ($SiO_2$), silicon nitride ($Si_3N_4$), and silicon oxynitride (SiON) have been widely used as insulators for transistor gates. As IC device geometry shrinks, gate dielectric layers have become progressively thinner. To maintain adequate breakdown voltage at very small thickness ($\leq 10$ nm), high dielectric constant (high-k) materials, defined as materials where k is greater than about 4.1 (the k of silicon dioxide) can be used as the insulating layer in the transistor gate structure and the barrier layer in deep trench capacitors. The latest and most promising high-k materials are metal oxides such as $Al_2O_3$, $HfO_2$, $ZrO_2$, and mixtures thereof, and metal silicates such as $HfSi_xO_y$, $ZrSi_xO_y$, and mixtures thereof. In some instances, nitrogen may be incorporated into these metal oxides and metal silicates high-k materials.

Semiconductor Process Chambers such as Chemical Vapor Deposition (CVD) chambers, and specifically Atomic Layer Deposition (ALD) chambers, which are employed for the deposition of high k films, often are exposed to highly corrosive gases during processing of semiconductor components or during periodic cleaning to remove accumulation of deposition residues from the interior surfaces. Among the highly corrosive gases employed for processing and cleaning are the halogen-containing agents, $Cl_2$, HCl, $BCl_3$, $NF_3$, $F_2$, HF and/or a combination of $BCl_3/NF_3$. Cleaning high-k ALD/CVD chambers using highly corrosive halogen-based chemistries activated by in situ plasma, remote plasma, and/or thermal heating have been demonstrated as being very effective. However, because $BCl_3$ or $BCl_{3/NF3}$ in situ plasmas are extremely aggressive, these halogen-based in situ plasmas, for example, not only remove high-k deposition residues from the reactor surfaces they also etch and corrode the internal components and surfaces of the ALD/CVD deposition chambers.

The following patents and articles are illustrative of processes for imparting resistance to corrosion and etching of ALD and CVD reactors which are subjected to halogen gases during processing of semiconductor components and from cleaning from time to time.

WO 02/054454 A2, and U.S. Pat. No. 6,537,429 B2, disclose the incorporation or corrosion resistant components in semiconductor processing equipment such as a plasma chamber. To prevent erosion caused by the corrosive effects of plasma chamber gases on walls, electrodes, supports, etc. commonly constructed of aluminum and aluminum alloys, diamond-like coatings are applied to such interior surfaces.

U.S. Pat. No. 6,533,910 B2 and WO 02/053794 A1 disclose corrosion resistant components for semiconductor processing equipment based upon carbonitride coatings. These coatings are deposited on the surface of the processing equipment, such surfaces include ceramic, stainless steel, refractory and the like as well as those coated with alumina, SiC, of $Si_3N_4$.

WO 02/053797 A1 discloses a method for providing corrosion resistance to metal, ceramic and polymer surfaces interior components of semiconductor processing apparatus including parts of a plasma reactor chamber. Hard carbon intermediate layers are incorporated into chamber surfaces which hard carbon intermediates include fullerenes such as $C_{60}$ and $C_{70}$ etc (buckyballs or buckmisterfullerenes), diamond, carbides, carbonitrides, borides and the like.

EP 1,026,281 A2, discloses an anti-corrosion member based upon a support having a film thereon incorporating a main crystal phase of $AlF_3$. Such film affords corrosion and erosion resistance to a base member of a metal in which aluminum is included, ceramics in which aluminum is included and so forth when heated to elevated temperatures in the presence of corrosive fluorine compounds, e.g., $WF_6$.

U.S. Pat. No. 2003/0159657 A1 and WO 03/001559 A1 disclose the application of a monolithic ceramic workpiece for a plasma reactor chamber formed from a mixture of yttrium aluminum perovskite and yttrium aluminum garnet. Such mixture acts to prevent erosion of the internal chamber components which are susceptible to corrosion and wear by fluorine processing gases.

WO 03/080892 A1, discloses components for semiconductor materials which are subjected to erosive and corrosive plasma environments. Such components are based upon ceramic coatings comprised of at least one oxide, nitride, boride, carbide and/or fluorides of strontium, lanthanum and dysprosium or a nitride, boride, carbide or fluoride of hafnium.

U.S. 6,613,442 B2, and WO 2004/003962 A2 disclose various methods to protect semiconductor processing chambers by employing various binary metal compounds such as aluminum nitride, boron nitride, and in particular, boron nitride/yttrium oxides and cerium oxides.

BRIEF SUMMARY OF THE INVENTION

This invention is broadly directed to chemical reaction chambers which are often exposed to highly corrosive atmospheres, and particularly to semiconductor process chambers such as ALD, CVD, and plasma etch chambers having internal surfaces and internal components exposed to such corrosive halogen based atmospheres. Layered superlattice materials having three or more metal elements such as strontium bismuth tantalate (SBT) are used to form a protective barrier against corrosion and erosion on the surfaces of the internal components of such chambers of reaction and semiconductor processing equipment. In addition, the invention relates to a process for imparting corrosion resistance to the interior surfaces and interior components of such chambers.

Several advantages in the above process are as follows:
  an ability to generate a protective film on semiconductor processing equipment which is resistant to many corrosive halogen gases employed in processing and cleaning of such equipment;
  an ability to generate a protective film for hard masks employed in plasma processing; and,
  an ability to generate a protective film on the surfaces of motion components, such as the surfaces of components in microelectromechanical systems (MEMS).

DETAILED DESCRIPTION OF THE INVENTION

One aspect of this invention is directed to a method for protecting the internal components of a reaction chamber such as those employed in semiconductor processing equipment, microelectromechanical reactors against halogen gases and/or a reactive species generator against physical and/or chemical damages. This method is particularly useful for protecting Chemical Vapor Deposition (CVD) Atomic Layer Deposition (ALD) chambers used to deposit high-dielectric constant materials against damages induced by chamber cleaning operation.

The materials of construction of the internal components of semiconductor processing equipment, such as CVD and ALD chambers, typically are based upon silicon or silicon compounds such as silicon oxide, quartz, glass, silicon carbide, silicon nitride, and/or silicon oxynitirde etc.; boron and boron compounds such as boron nitride, boron carbide, ceramics such as alumina, metals such as aluminum, titanium, steel, carbon steel, stainless steel etc., and/or metal compounds such as aluminum nitride, titanium nitride, titanium carbide, titanium oxide etc., and carbon or carbon containing compounds including polymers such as polyimide and/or Teflon etc. Aluminum chambers are quite common and are the types of chambers that are highly susceptible to corrosion when cleaned with various halogen based chemistries.

Layered superlattice materials when applied to the interior surfaces have been found to be extremely stable and inert against physical sputtering and chemical corrosion/etch during halogen-based etch/clean processes. Coatings or films of these superlattice materials are applied on the interior surfaces of the chamber to protect the internal components of semiconductor processing chambers against damage induced by halogen-based chamber cleaning processes.

A layered superlattice material is defined as a material that (1) has a single chemical formula; and (2) forms alternating layers with distinctly different crystalline structure. To be effective, the thin film of superlattice material must contain three or more metal elements, and at least one of the metal elements should not form a volatile oxide, halide, or hydride, etc. The layered structures consist of sublattices of one or more perovskite-like layers and sublattices of one or more intermediate non-perovskite-like layers. The sublattices of perovskite-like layers and the sublattices of non-perovskite-like layers are linked in an interdependent manner, forming a superlattice. Representative layered superlattice materials have been summarized by the general formula for layered superlattice materials as:

$$A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+b2}\ldots Bl_{yl}^{+bl}Q_z^{-2} \quad (1)$$

where A1, A2, . . ., and Aj represent A-site elements in the perovskite-like structure. Examples of A-site elements are strontium, calcium, barium, bismuth, cadmium, and lead etc. The terms S1, S2, . . ., and Sk represent superlattice generator elements. Examples of superlattice generator elements are bismuth, yttrium, scandium, lanthanum, antimony, chromium, thallium, and other elements with a valence of +3. The terms B1, B2, . . ., and Bl represent B-site elements in the perovskite-like structure. Examples of B-site elements are titanium, tantalum, hafnium, tungsten, niobium, zirconium, etc. The term Q in the formula represents an anion with the most common anion element being oxygen, although the anion can also be fluorine, chlorine, or a combination of the anion elements such as oxyfluorides and oxychlorides etc. The superscripts in equation (1) indicate the valences of the elements. The subscripts in equation (1) represent the average number of atoms in a unit cell. The subscripts w, x, y, and z can be integer or fractional numbers, with the following constraint:

$$2\sum_{j=1}^{J}(ajwj) + \sum_{k=1}^{k}(skxk) + \sum_{l=1}^{l}(blyl) = 2z. \quad (2)$$

The most common example of a layered superlattice material is strontium bismuth tantalate (SBT), having the formula $SrBi_2Ta_2O_9$. Other composition variations of SBT superlattice materials are represented by the formula $Sr_{(1-x)}Bi_{(2+0.6667x)}Ta_2O_9$, where x=0 to 0.99. Other examples of strontium based superlattice materials include strontium bismuth niobate (SBN) $Sr_{(1-x)}Bi_{(2+0.6667x)}Nb_2O_9$, where x=0 to 0.99, and strontium bismuth tantalate niobate (SBTN) $Sr_{(1-x)}Bi^{(2+0.6667x)}Ta_yNb_{(2-y)}O_9$, where x=0 to 0.99, and y=0 to 2 Other examples of a layered superlattice material are $BaBi_2Ta_2O_9$, and $PbBi_2Ta_2O_9$, and $BaBi_2Nb_2O_9$. etc.

The thin films of superlattice materials can be polycrystalline or in amorphous form. They should be nonporous and dense. They should also be amorphous or their grains should be small enough so that reactive halogen species cannot diffuse through extended grain boundaries. The thickness of the protective superlattice barrier coating generally is from 1 nm to 100 micrometer, preferably from 10 nm to 10 micrometers, and most preferably from 100 nm to 1 micrometer.

The thin films of layered superlattice materials, such as SBT, can be coated onto the reactor chamber surfaces by traditional coating methods. Such methods include misted vapor deposition using liquid precursors, application of homogeneous aqueous solutions followed by evaporation of the solvents, annealing, metalorganic chemical vapor deposition (MOCVD), metalorganic decomposition, application of a sol-gel containing the precursors followed by rapid thermal processing, chemical vapor deposition (CVD), atomic layer deposition (ALD), atomic layer chemical vapor deposition (ALCVD), sputtering, sputtering deposition, sputter coating, and physical vapor deposition (PVD), immersion coating, electron beam evaporation and condensation, ion beam deposition, hot isostatic pressing, cold isostatic pressing, compression molding, casting, compacting and sintering, plasma spraying, thermal spraying, flame spraying, brush coating, atmospheric plasma deposition, dielectric barrier discharge deposition, hollow cathode discharge deposition etc.

The following examples are intended to illustrate various embodiments of the invention and are not intended to restrict the scope thereof.

EXAMPLE 1

A Silicon Wafer With Superlattice Material

A silicon wafer was first coated with about 300 nm thick of silicon oxide ($SiO_2$), followed by a layer of about 500 nm thick SBT. The calculated x-ray diffraction pattern of crystalline was that of $SrBi_2Ta_2O_9$. X-ray reflectivity data, and the mode that best fits the data, i.e., achieving the best agreement between predicted and measured x-ray reflectivity data, revealed a film thickness of about 504 nm thick and a density of 8.250 g/cm³. This density is only slightly less than the density of single crystalline SBT of 8.78 g/cm³. This indicates that there was no significant porosity in this film.

EXAMPLE 2

Barrier Resistance of Superlattice Materials to Remote $NF_3$ Plasma Downstream Etching in Semiconductor Processing Equipment The purpose of this example is to determine whether the $SrBi_2Ta_2O_9$ superlattice material of Example 1 has the potential to provide barrier, i.e., corrosion, resistance to the interior surfaces and components in semiconductor processing equipment when such surfaces and components are exposed to a halogen gas employed in processing or during cleaning of reaction chambers such as semiconductor process chambers.

A sample coupon of about one-inch square cut from the SBT wafer in Example 1 was placed onto a carrier wafer. As a comparative, a one-inch square control coupon cut from a bare silicon wafer was placed adjacent to the SBT coupon. The weights of both coupons were measured before placing the coupons onto the carrier wafer. Then the edges of both test coupons were sealed with Kapton tapes. Sealing the coupon edges was done to eliminate possible etch reactions from the backside of the test coupons, hence ensuring only that the top surface of the each coupon was exposed to the $NF_3$ reactive gas.

The test wafer was then placed in a reactor downstream to an Astron remote plasma generator. After evacuating the reactor chamber, a remote plasma was generated with the following recipe: 100 sccm (standard cubic centimeter per minute) of $NF_3$ flow, 100 sccm of Ar flow, 4 Torr downstream chamber pressure, and 1 kW RF power. The Astron unit was turned off and process gas flows were terminated after 10 minute processing. The reactor was completely evacuated and then vented with nitrogen. The test and control wafers were retrieved from the reactor and weighed again. The results are given in Table 1.

TABLE 1

| Sample | Weight before processing (g) | Weight after processing (g) | Weight change (g) | Etch Rate (mg/min) |
|---|---|---|---|---|
| Si- control | 0.8166 | 0.8018 | 0.0148 | 1.48 |
| SBT- Example 1 | 1.0229 | 1.0229 | 0.0000 | 0.00 |

As is known, a remote $NF_3$ plasma is highly effective in etching/removing silicon and that fact is shown by the control Si-coupon in Table 1. A high weight loss rate (etch rate) of 1.48 mg/min was observed on the bare control silicon coupon. In contrast, no weight loss was observed on the SBT coated coupon. This fact is established because the reactive species generated by the $NF_3$ remote plasma did not permeate through the SBT film and etch the underlying Si.

This example demonstrates (1) that an SBT film is not susceptible to etching and corrosion by a typical, remote $NF_3$ plasma downstream cleaning process; and, (2) that an SBT film can be coated onto a substrate by the process of Example 1 and generates a coupon having a noncorrosive surface which is nonporous and dense. From this data, it is concluded that a thin layer of a superlattice SBT film can form an effective protective barrier against reactive fluorine species generated by an $NF_3$ remote plasma.

EXAMPLE 3

Barrier Resistance to HCl in Reactive Ion Etcher

A SBT sample coupon similar to that in Example 1 was placed onto a 4 inch carrier wafer. The carrier wafer was then placed onto the lower electrode of a capacitively coupled reactive ion etcher. The lower electrode was powered by a 13.56 MHz RF generator via an automatic matching network. The temperature of the RF powered lower electrode was set at 20° C. by a re-circulating chiller. Process gases were fed into the reactor via a showerhead on the grounded top electrode.

In this example, hydrogen chloride (HCl) was used as the reactive (etchant) gas. The SBT film thickness was measured both before and after plasma processing by a reflectometer. Changes in SBT film thickness were used to determine if there was a loss of SBT. Table 2 lists the two test process recipes and results.

TABLE 2

| RF Power (W) | Pressure (mTorr) | HCl Flow (sccm) | DC Bias (V) | Etch Rate (nm/min) |
|---|---|---|---|---|
| 200 | 250 | 20 | 370 | −8.87 |
| 200 | 100 | 20 | 570 | −6.97 |

The negative etch rates in Table 2 indicate that the film thickness increased slightly after processing. This is believed primarily due to partial incorporation of chlorine atoms into the SBT superlattice structures. In any case, there was no loss of the SBT film or the underlying silicon.

It is also important to note that since the SBT sample coupon was placed on the RF powered electrode, than on the grounded reactor surfaces, the SBT films were exposed to the bombardment of high energy ions and reactive species, as indicated by the high DC bias voltage which is a more severe test.

This example thus demonstrates that a thin layer of SBT film can form an effective protective barrier against ion bombardment and reactive chlorine species generated by in situ HCl plasma.

EXAMPLE 4

Barrier Resistance to $BCl_3$ in Reactive Ion Etcher

The SBT sample coupon and the in situ plasma reactor are similar to those employed in Example 3. The process gas in this example is boron trichloride ($BCl_3$). Table 3 lists the recipes and results.

TABLE 3

| RF Power (W) | Pressure (mTorr) | $BCl_3$ Flow (sccm) | DC Bias (V) | Etch Rate (nm/min) |
|---|---|---|---|---|
| 100 | 500 | 20 | 120 | −4.20 |
| 200 | 500 | 20 | 280 | −7.05 |

Similar to Example 3, the film thickness increased slightly after $BCl_3$ plasma processing. No loss of SBT or the underlying silicon was observed.

This example demonstrates that a thin layer of SBT film can form an effective protective barrier against ion bombardment and reactive chlorine species generated by in situ $BCl_3$ plasma.

EXAMPLE 5

Barrier Resistance to Cl₂ in Reactive Ion Etcher

The SBT sample coupon and the in situ plasma reactor are similar to those in Example 3. The process gas in this example is chlorine (Cl$_2$). Table 4 lists the test recipes and results.

TABLE 4

| RF Power (W) | Pressure (mTorr) | Cl$_2$ Flow (sccm) | DC Bias (V) | Etch Rate (nm/min) |
|---|---|---|---|---|
| 200 | 500 | 20 | 110 | −2.73 |
| 200 | 250 | 20 | 268 | −5.85 |
| 200 | 100 | 20 | 440 | −6.54 |

Similar to Example 3, the film thickness increased slightly after Cl$_2$ plasma processing. No loss of SBT or the underlying silicon was observed.

This example demonstrates that a thin layer of SBT film can form an effective protective barrier against ion bombardment and reactive chlorine species generated by in situ Cl$_2$ plasma.

EXAMPLE 6

Barrier Resistance to BCl₃/NF3/He in Reactive Ion Etcher

The SBT sample coupon and the in situ plasma reactor are similar to those in Example 3. The process gas in this example is a mixture of BCl3/NF3/He. Table 5 lists the recipes and results.

TABLE 5

| RF Power (W) | Pressure (mTorr) | BCl$_3$ Flow (sccm) | NF$_3$ Flow (sccm) | He Flow (sccm) | DC Bias (V) | Etch Rate (nm/min) |
|---|---|---|---|---|---|---|
| 200 | 500 | 10 | 10 | 20 | 230 | −0.33 |

Similar to Example 3, the thin film thickness increases slightly after processing. No loss of SBT or the underlying silicon was observed.

This example demonstrates that a thin layer of SBT film can form an effective protective barrier against ion bombardment and reactive chlorine and fluorine species generated by in situ BCl$_3$/NF$_3$/He plasma.

EXAMPLE 7

Barrier Resistance to ClF₃ In Thermal Etch Reactor

The SBT sample coupon was similar to that in Example 3. The SBT sample coupon along with the 4 inch carrier wafer was placed on a heated pedestal inside a thermal etch reactor. After sample placement, the reactor was evacuated to baseline pressure and the pedestal resistive heaters were turned on. After the pedestal reached the temperature setpoint, the process gas, chlorine trifluoride (ClF$_3$), was introduced into the reactor to reach a pressure of 100 Torr. After 20 minutes exposure, the process ClF$_3$ flow was stopped and reactor chamber evacuated. Then, the chamber was vented with nitrogen and the test sample retrieved.

The results indicated that at a substrate temperature of 500° C., no etching of SBT was observed after exposure to ClF$_3$ thermal processing.

This example demonstrates that a thin layer of SBT film can form an effective protective barrier against ClF$_3$ thermal processing.

In summary, Examples 2–7 demonstrate the resistance to corrosion of superlattice coated surfaces of the type employed in chemical reaction chambers, including semiconductor process chambers, such as, ALD and CVD chambers, when exposed to aggressive halogen chemistries even under severe processing conditions. These halogen chemistries and conditions are representative of a wide range of wafer etching and chamber cleaning processes employed in semiconductor manufacturing. For example, such halogen chemistries are employed for removal of deposition products generated on the internal surfaces of reaction chambers, such as ALD and CVD reaction chambers, etc. associated with the deposition of high-k materials (such as Al$_2$O$_3$, HfO$_2$, HfSiO$_4$, etc. or mixtures thereof.

The results also show that a thin coat of a superlattice mater such as SBT, on the surfaces of the internal components of semiconductor processing equipment can effectively protect the components against corrosion or damages during semiconductor processing.

The invention claimed is:

1. A chemical reaction chamber having an interior surface thereof coated with a corrosion resistant film of a layered superlattice material.

2. The chemical reaction chamber of claim 1 wherein the layered superlattice material is represented by the formula:

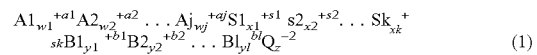

$$A1_{w1}^{+a1}A2_{w2}^{+a2}\ldots Aj_{wj}^{+aj}S1_{x1}^{+s1}s2_{x2}^{+s2}\ldots Sk_{xk}^{+} {}_{skB1_{y1}}^{+b1}B2_{y2}^{+b2}\ldots Bl_{yl}^{bl}Q_z^{-2} \quad (1)$$

where A1, A2, and Aj represent A-site elements in the perovskite-like structure, the terms S1, S2, . . . , and Sk represent superlattice generator elements, the terms B1, B2, . . . , and Bl represent B-site elements in the perovskite-like structure, the term Q in the formula represents an anion, the superscripts indicate the valences of the elements and represent the average number of atoms in a unit cell, and subscripts w, x, y, and z can be integer or fractional numbers, with the following constraint:

$$2\sum_{j=1}^{J}(ajwj) + \sum_{k=1}^{k}(skxk) + \sum_{l=1}^{l}(blyl) = 2z. \quad (2)$$

3. The chemical reaction chamber of claim 2 wherein the A-site elements are selected from the group consisting of strontium, calcium, barium, bismuth, cadmium, and lead.

4. The chemical reaction chamber of claim 3 wherein the S site superlattice generator elements are selected from the group consisting of bismuth, yttrium, scandium, lanthanum, antimony, chromium, thallium, and elements having a valence of +3.

5. The chemical reaction chamber of claim 4 wherein the B-site elements are selected from the group consisting of titanium, tantalum, hafnium, tungsten, niobium, and zirconium.

6. The chemical reaction chamber of claim 5 wherein with the anion element is selected from the group consisting of oxygen, fluorine, chlorine, or a combination of the anion elements.

7. In a semiconductor process chamber having a corrosion resistant coating applied to an interior surface, the improvement which comprises, a corrosion resistant coating comprised of a layered strontium based superlattice material selected from the group consisting of strontium bismuth tantalite, strontium bismuth niobate, strontium bismuth tantalate niobate, $BaBi_2Ta_2O_9$, $PbBi_2Ta_2O_9$, and $BaBi_2Nb_2O_9$.

8. The semiconductor process chamber of claim 7 wherein the coating of superlattice material is represented by the formula $Sr_{(1-x)}Bi_{(2+0.6667x)}Ta_2O_9$, where x=0 to 0.99.

9. The semiconductor process chamber of claim 7 wherein the strontium based superlattice material is a strontium bismuth niobate of the formula (SBN) $Sr_{(1-x)}Bi_{(2+0.6667x)}Nb_2O_9$, where x=0 to 0.99.

10. The semiconductor process chamber of claim 7 wherein the strontium based superlattice material is a strontium bismuth tantalate niobate of the formula (SBTN) $Sr_{(1-x)}Bi_{(2+0.6667x)}Ta_yNb_{(2-y)}O_9$, where x=0 to 0.99, and y=0 to 2.

11. The semiconductor process chamber of claim 7 wherein the coating material is represented by the formula $SrBi_2Ta_2O_9$.

12. In a process for imparting corrosion resistance to an interior surface of a semiconductor process chamber on exposure to a halogen containing gas; the improvement which comprises:
applying a corrosion resistant coating comprised of a layered superlattice material on said interior surface prior to exposure to said halogen containing gas and said halogen containing gas selected from the group consisting of $Cl_2$, HCl, $BCl_3$, $NF_3$, $F_2$, and HF.

13. The process of claim 12 wherein said interior surface of said semiconductor process chamber is coated with a film of a layered superlattice material having a thickness of between 1 nm and 100 micrometer.

14. The process of claim 13 wherein the thickness is from 10 nm to 10 micrometers.

15. The process of claim 13 wherein the interior surface of said semiconductor process chamber is constructed of a material selected from the group consisting of silicon oxide, quartz, silicon carbide, silicon nitride, stainless steel, titanium, and aluminum.

16. The process of claim 13 wherein the coating of said superlattice material is a strontium based material selected from the group consisting of strontium bismuth tantalite, strontium bismuth niobate, and strontium bismuth tantalate niobate.

17. The semiconductor process chamber of claim 15 wherein the coating of superlattice material is represented by the formula $Sr_{(1-x)}Bi_{(2+0.6667x)}Ta_2O_9$, where x=0 to 0.99.

18. The semiconductor process chamber of claim 15 wherein the strontium based superlattice material is a strontium bismuth niobate of the formula $Sr_{(1-x)}Bi_{(2+0.6667x)}Nb_2O_9$, where x=0 to 0.99.

19. The semiconductor process chamber of claim 15 wherein the strontium based superlattice material is a strontium bismuth tantalate niobate of the formula (SBTN) $Sr_{(1-x)}Bi_{(2+0.6667x)}Ta_yNb_{(2-y)}O_9$, where x=0 to 0.99, and y=0 to 2.

* * * * *